United States Patent [19]
Freerks et al.

[11] Patent Number: 5,980,194
[45] Date of Patent: *Nov. 9, 1999

[54] WAFER POSITION ERROR DETECTION AND CORRECTION SYSTEM

[75] Inventors: Frederik W. Freerks, Cupertino; Lloyd M. Berken, Fremont; M. Uenia Crithfield, San Jose; David Schott, Santa Clara; Michael Rice, Pleasanton, all of Calif.; Michael Holtzman, Kfar Saba, Israel; William Reams, Austin, Tex.; Richard Giljum, Milpitas; Lance Reinke, Pleasanton, both of Calif.; John S. Booth, Austin, Tex.

[73] Assignee: Applied Materials, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/679,885

[22] Filed: Jul. 15, 1996

[51] Int. Cl.$^6$ .................................................. B25J 15/06
[52] U.S. Cl. .......................... 414/754; 414/936; 414/939; 414/941; 318/640
[58] Field of Search ................................. 414/744.5, 754, 414/935, 936, 939, 941; 318/640

[56] References Cited

U.S. PATENT DOCUMENTS

| | | |
|---|---|---|
| 4,158,171 | 6/1979 | Abbe et al. . |
| 4,409,087 | 10/1983 | Quick . |
| 4,513,430 | 4/1985 | Vora et al. ................................. 377/39 |
| 4,603,466 | 8/1986 | Morley . |
| 4,657,621 | 4/1987 | Johnson et al. ......................... 414/939 |
| 4,697,089 | 9/1987 | Drage . |
| 4,770,590 | 9/1988 | Hughes et al. . |
| 4,819,167 | 4/1989 | Cheng et al. . |
| 4,836,733 | 6/1989 | Hertel et al. . |
| 5,054,991 | 10/1991 | Kato . |
| 5,103,367 | 4/1992 | Horwitz et al. . |
| 5,194,743 | 3/1993 | Aoyama et al. . |
| 5,319,216 | 6/1994 | Mokuo et al. .......................... 414/938 |
| 5,378,994 | 1/1995 | Novak et al. . |
| 5,436,790 | 7/1995 | Blake et al. . |
| 5,447,121 | 9/1995 | Watanabe et al. . |
| 5,483,138 | 1/1996 | Shmookler et al. . |
| 5,539,323 | 7/1996 | Davis, Jr. . |
| 5,556,147 | 9/1996 | Somekh et al. .......................... 414/939 |
| 5,563,798 | 10/1996 | Berken et al. ........................... 414/935 |
| 5,606,251 | 2/1997 | Ryle et al. . |

FOREIGN PATENT DOCUMENTS 6154624  6/1994  Japan .

OTHER PUBLICATIONS

U.S. application No. 08/998,451, filed Dec. 26, 1997 (Atty. Dk. # 1979/PVD/DV).

*Primary Examiner*—Christopher P. Ellis
*Assistant Examiner*—Gregory A. Morse
*Attorney, Agent, or Firm*—Konrad Raynes & Victor

[57] ABSTRACT

A wafer position error detection and correction system determines the presence of a wafer on a wafer transport robot blade. The system also determines a wafer position error by monitoring the position of the wafer with respect to the blade with one sensor which is located proximate to each entrance of a process chamber. When a wafer position error is detected, the system determines the extent of the misalignment and corrects such misalignment if correctable by the wafer transport robot or alerts an operator for operator intervention. The system incorporates a transparent cover on the surface of the wafer handling chamber and four optical detection sensors disposed on the surface of the transparent cover, in which each sensor is placed proximate to the entrance of the process chamber. In addition, an I/O sensor is placed adjacent the I/O slit valve to detect and correct wafer position errors. The detection sensors direct light through the wafer handling chamber to reflectors on the floor of the transfer chamber which reflect the light back to the detector sensors. A detector within the detector sensor detects when the beam path from the position sensor to the reflector is uninterrupted. As a wafer is retracted out of a process chamber or a wafer cassette, the position of the wafer with respect to the blade is measured, thus determining whether the wafer is properly placed on the wafer.

31 Claims, 8 Drawing Sheets

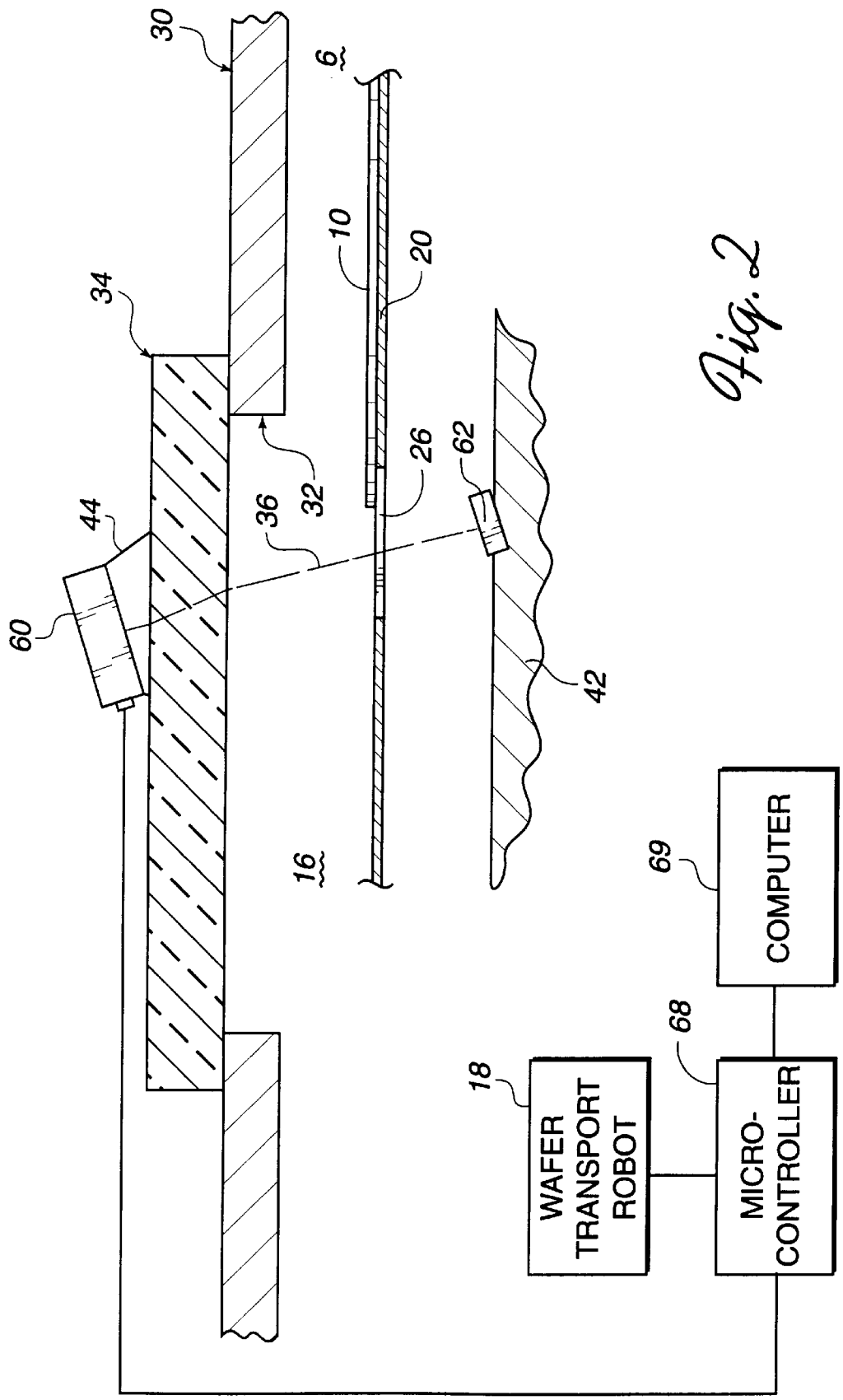

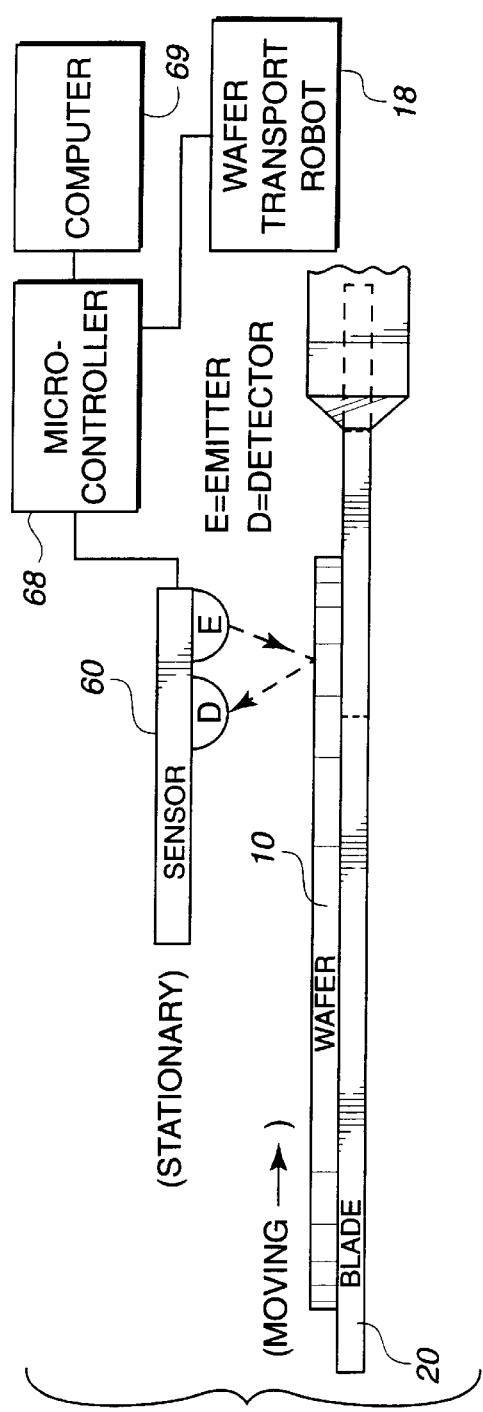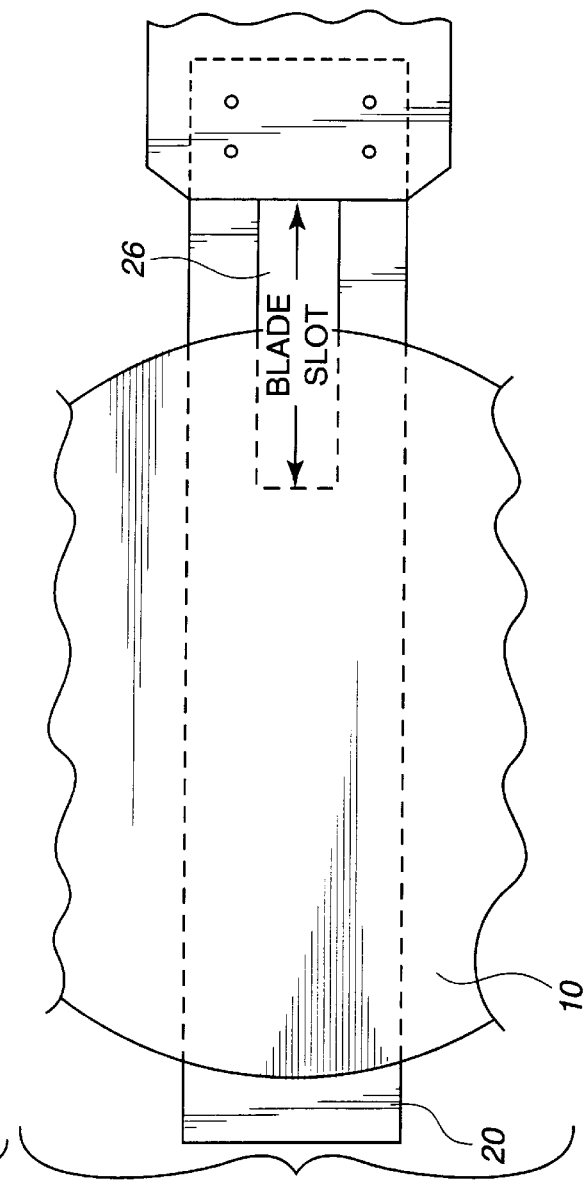

WAFER POSITION ERROR DETECTION AND CORRECTION SYSTEM

BACKGROUND OF THE INVENTION

1. Field of the Invention

The present invention relates to an equipment for robotically transporting wafers between storage and process chambers, and in particular, for detecting and correcting wafer position errors.

2. Description of Related Art

A common configuration for semiconductor processing equipment utilizes a number of different processing chambers accessible from a central wafer storage and handling ("transfer") chamber. FIG. 1A schematically illustrates a semiconductor processing system having such a configuration. Wafers are typically loaded into the processing system in wafer cassettes and then the wafers are individually transferred from the cassettes to a wafer storage elevator within the central transfer chamber. A wafer transport robot moves individual wafers from the wafer storage elevator through the valves in the transfer chamber wall, into the different processing chambers, and then between chambers to effect different processing steps. Movement of semiconductor wafers within the processing equipment is accomplished using automated wafer handling techniques to allow for the complete automation of the fabrication process.

Because wafer processing occurs in a vacuum environment and cost considerations necessitate fast pumping times to facilitate high wafer throughput, the total volume of a wafer processing system is limited. Consequently, the clearances and tolerances within a wafer processing equipment are typically limited by space considerations. For example, one type of wafer storage elevator stores wafers in a recess that allows only a few millimeters of clearance to either side of the wafer. Misaligned wafers may be dislodged from the wafer storage elevator or may be damaged in other ways. Considering the complexity of semiconductor devices and the number of devices on each wafer, each wafer represents a substantial investment, and any level of wafer breakage is undesirable. Accordingly, wafer transfers must be precise.

Normally, stepper motor driven wafer transport robots under computer control are capable of repeatedly transporting wafers through a processing system with great precision. However, the effectiveness of such wafer handling techniques can be greatly diminished if the initial wafer position with respect to the wafer transport robot is not known accurately.

Conventionally, the wafer transport robots use a vacuum pickup method to hold the wafer and capacitive sensors to detect the presence of the wafer on a wafer carrying blade, commonly referred to as the "blade." The capacitive position sensors within the blade of the wafer transport robot are used to detect if the wafer is improperly seated on the blade. Such capacitive systems are often inaccurate and fail to detect most wafer misalignment problems. The elimination of the vacuum pickup and their capacitive sensors has required the need for a different wafer detection and correction scheme.

Some types of wafer processing equipment use one or more techniques to measure a wafer's position and to ensure that the wafer is situated at a predefined position. For example, U.S. Pat. No. 4,819,167 to Cheng, et al., entitled "System and Method for Detecting the Center of an Integrated Circuit Wafer," describes a wafer processing system which includes a sensor array for determining the position of a wafer as it is loaded from an external cassette onto an internal wafer storage elevator. The Cheng wafer positioning system ensures that wafers loaded into the processing equipment are accurately positioned on a given level of the wafer storage elevator. Using a system in accordance with the teachings of the Cheng patent ensures that wafers stored within the wafer storage elevator are initially at a well defined position with respect to the wafer transport robot when the wafers are accessed by the wafer transport robot.

Systems which incorporate the teachings of the Cheng patent nevertheless experience unacceptable levels of wafer breakage. These unacceptable levels are likely caused by inaccurate wafer accessing operations or by wafers being dislodged from their nominal position either during processing or transport. Thus, further measures are desirable to ensure that wafers are at their predetermined positions.

A second type of center finding system is described in U.S. Pat. No. 5,483,138, entitled "System and Method for Automated Positioning of a Substrate in a Processing Chamber," which lists Shmookler, et al., as inventors (hereinafter, the "Shmookler system"). U.S. Pat. No. 5,483,138 is assigned to the assignee of the present invention. The Shmookler system is a wafer center finding system which uses four photoelectric position sensors to locate the center of a wafer as the wafer is moved between process chambers. An array of optical sources are disposed above the central wafer transport chamber and a corresponding array of optical detectors are disposed below the chamber. The illustrated sensor array allows the identification of wafer positions, but requires that the wafer transport chamber be optically accessible from both the top and the bottom of the chamber. This photoelectric sensor array is arranged so that the light travels along a path generally perpendicular to the plane in which the wafer is transported. In practice, this type of sensor geometry may lead to erroneous position information due to multiple reflections from the surfaces of the top and bottom chamber covers and from the wafer. To compensate for such erroneous position data, the Shmookler system samples more data points than is necessary, discarding data that does not fall within expected limits.

The Shmookler system uses a data collection scheme which relies on particular points on the edge of a wafer crossing the four sensor array in a particular order. This scheme works well when wafers are positioned near to their nominal position. However, wafers that are in danger of breaking in the course of a transport operation may be dislodged from their nominal position by a large amount. For such substantially misaligned wafers, the Shmookler system will not appropriately identify the wafer position, and the wafers that are substantially out of position may consequently be broken.

SUMMARY OF THE DISCLOSURE

It is an objective of the present invention to provide a wafer presence detection and a wafer-on-blade position error detection at each time a wafer is removed from either a process chamber or a wafer cassette.

A preferred embodiment of the present invention includes a wafer handling chamber having a vacuum sealable opening for admitting wafers from a region external to the wafer handling chamber. The wafer handling chamber has at least a portion of a wall formed from a substantially transparent material to provide a window. At least one wafer holding chamber is disposed adjacent to the wafer handling chamber. The wafer holding chamber has an opening large enough to admit a wafer. Also included is a wafer transport robot capable of translating a wafer along a first coordinate direction and along a second coordinate direction. Preferably, the wafer transport robot has a blade adapted for carrying wafers, in which the blade has a slot and defines a center hole. This embodiment also includes at least one detection sensor disposed to detect an edge of the slot and an edge of the wafer as the wafer is retracted from the wafer holding chamber. The detection sensor includes a light source disposed external to the wafer handling chamber. The light source is aligned to direct an incident beam of light through the window into the wafer handling chamber. The detection sensor further includes a reflector disposed within the wafer handling chamber so that at least a portion of the incident beam of light is reflected from the reflector as a reflected beam of light. The reflector, which preferably is polished aluminum, directs the reflected beam of light through the window to a detector. Preferably included in the detection sensor is the detector disposed external to the wafer handling chamber to receive the reflected beam of light from the reflector. The light source and the detector are disposed to detect an edge of the slot when the slot allows the reflected beam of light to reflect through the transparent material and to further detect an edge of the wafer when the wafer intercepts a beam of light as the wafer is removed from or inserted into the wafer holding chamber. By detecting both events, it is possible to determine the position of the wafer.

In accordance with a further aspect of this preferred embodiment, the present invention includes a controller device for identifying the distance between the edge of the slot and the edge of the wafer on the blade as the wafer transport robot is translated along the first coordinate direction. The identification of the distance is performed in response to a robot output signal from the movement of the wafer transport robot in the first coordinate direction and a sensor output signal from the detection sensor.

When a misalignment of the wafer with respect to the blade is within a predetermined value, the controller device inhibits a corrective action. However, if the misalignment of the wafer is greater than the predetermined value, the controller device causes a corrective action by controlling the wafer transport robot to correct for the misalignment of the wafer. More particularly, the position of a misaligned wafer can be adjusted by altering a set of coordinate positions corresponding to a predetermined destination position by an amount substantially equal and opposite to the wafer's misalignment. If the misalignment of the wafer is more than a predetermined maximum value, the controller device informs an operator to engage operator intervention. Yet a further aspect of this preferred embodiment include the detection sensor which determines a presence of the wafer through the center hole, when the wafer transport robot is fully retracted and withdrawn away from the wafer holding chamber.

These and other aspects, features and advantages of the present invention will be better understood by studying the detailed description in conjunction with the drawings and the accompanying claims.

BRIEF DESCRIPTION OF THE DRAWINGS

A detailed description of embodiments of the invention will be made with reference to the accompanying drawings, wherein like numerals designate corresponding parts in the several figures.

FIG. 2 illustrates a preferred embodiment of a sensor system in accordance with the present invention.

FIG. 3A is a partial side view of an embodiment using an alternative sensor system;

FIG. 3B is a top view of FIG. 3A;

DETAILED DESCRIPTION OF THE PREFERRED EMBODIMENTS

Preferred embodiments of the present invention detect wafer positions as wafers are transported within a semiconductor processing equipment and compensate for wafer misalignments when the wafers are not at or very near their nominal position on the wafer transport robot. The wafer position error detection and correction system of the present invention preferably determines the error in wafer position and compensates for this error by adjusting the linear and rotational position of the wafer transport robot. Positional adjustments are made so that the wafer transport robot will transport the wafer to its nominal position either within the wafer storage elevator or within the designated wafer processing chamber. In a preferred embodiment of the present invention, the wafer position is detected when the wafer is removed from a process chamber or from a wafer cassette.

Wafer positions with respect to the robot blade are preferably detected by determining the position of the wafer when an edge of a slot in the robot blade and an edge of the wafer crosses an optical beam path during retraction of the wafer from either a processing chamber or a wafer cassette. Positional information derived from these wafer position data points may be compared with predetermined, nominal positional information to determine the extent of the wafer misalignment. This error information is preferably converted into an error component, and the linear extension and rotational displacement of the wafer transport robot are adjusted accordingly to compensate for the misalignment.

Figure 1A:
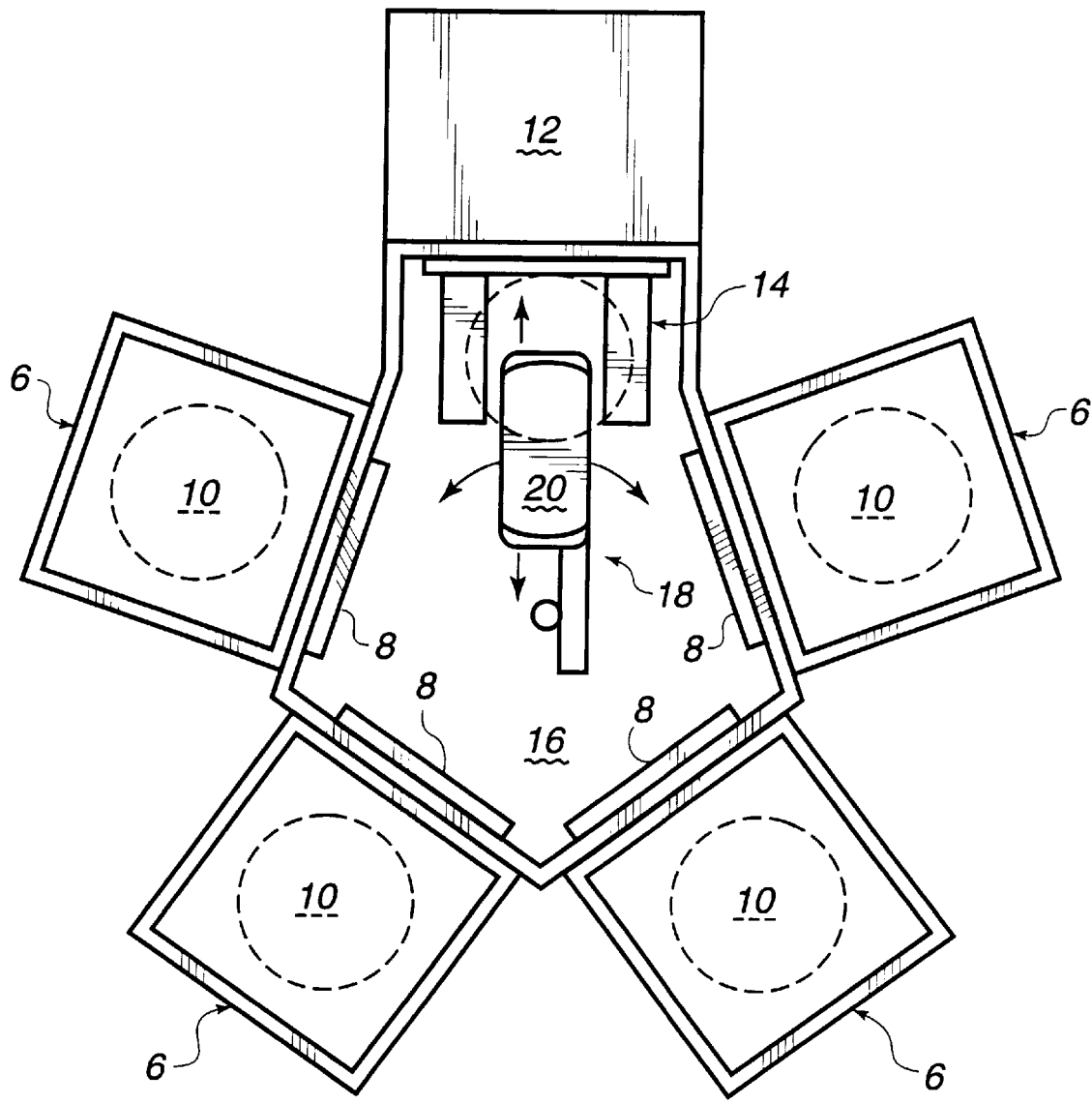
FIG. 1A is a top plan view of a semiconductor processing system.

FIG. 1A shows a plan view of a wafer processing system which may accommodate the wafer position error detection and correction system of the present invention. The wafer processing system of FIG. 1A consists of a number of individual process chambers 6 that can be isolated by closing slit valves 8. Wafers 10, for example eight inch silicon wafers, undergo a variety of processing steps within the various processing chambers 6. Typically, a plurality of wafers within a wafer cassette (shown in FIG. 4a) are loaded into and loaded from the wafer processing system through a chamber 12. Preferably, wafers are loaded into the wafer processing system and onto the wafer storage elevator 14 in accordance with the method taught by U.S. Pat. No. 4,819,167 to Cheng et al., entitled "System and Method for Detecting the Center of an Integrated Circuit Wafer," assigned to the assignee of the present invention, and incorporated herein by reference.

During processing, the wafers 10 are transported from the wafer transfer elevator 14 through the transfer chamber 16 and into the various process chambers 6 via the slit valves 8 in the walls of the transfer chamber walls. Movement of the wafers 10 between the wafer storage elevator 14 and the various wafer process chambers 6 is accomplished by means of a wafer transport robot 18. The wafer transport robot 18 is capable of lifting a wafer 10 from the wafer storage elevator 14. By a combination of linear and rotational translations, the wafer transport robot 18 transports the wafer 10 through a selected open vacuum chamber slit valve 8, and deposits the wafer at the appropriate position within the selected wafer process chamber 6. Similarly, the wafer transport robot 18 is capable of transporting a wafer 10 from one process chamber 6 to another and from a processing chamber 6 back to the wafer storage elevator 14.

The linear and rotational translation mechanisms of the wafer transport robot 18 are indicated schematically in FIG. 1A. A preferred embodiment of a transport mechanism utilizes two magnetically coupled two stepper motors under the control of the processing system computer, with one stepper motor controlling linear extension and the other stepper motor controlling rotation. The magnetic drive assembly consists of two external circular drive magnet assemblies and two circular internal drive magnet assemblies. The assemblies are separated by a stainless steel sleeve which provides a vacuum isolation and further provides the mountings for the outer magnet assemblies, drive motors and gears. In an embodiment, there are 40 magnets in each of the coupling assemblies for a total of 160 for the completed magnetic drive assembly. The magnets are mounted so that each end of the magnet becomes a pole piece and couples to a mating magnet in each of the inner and outer assemblies.

Figure 1B:
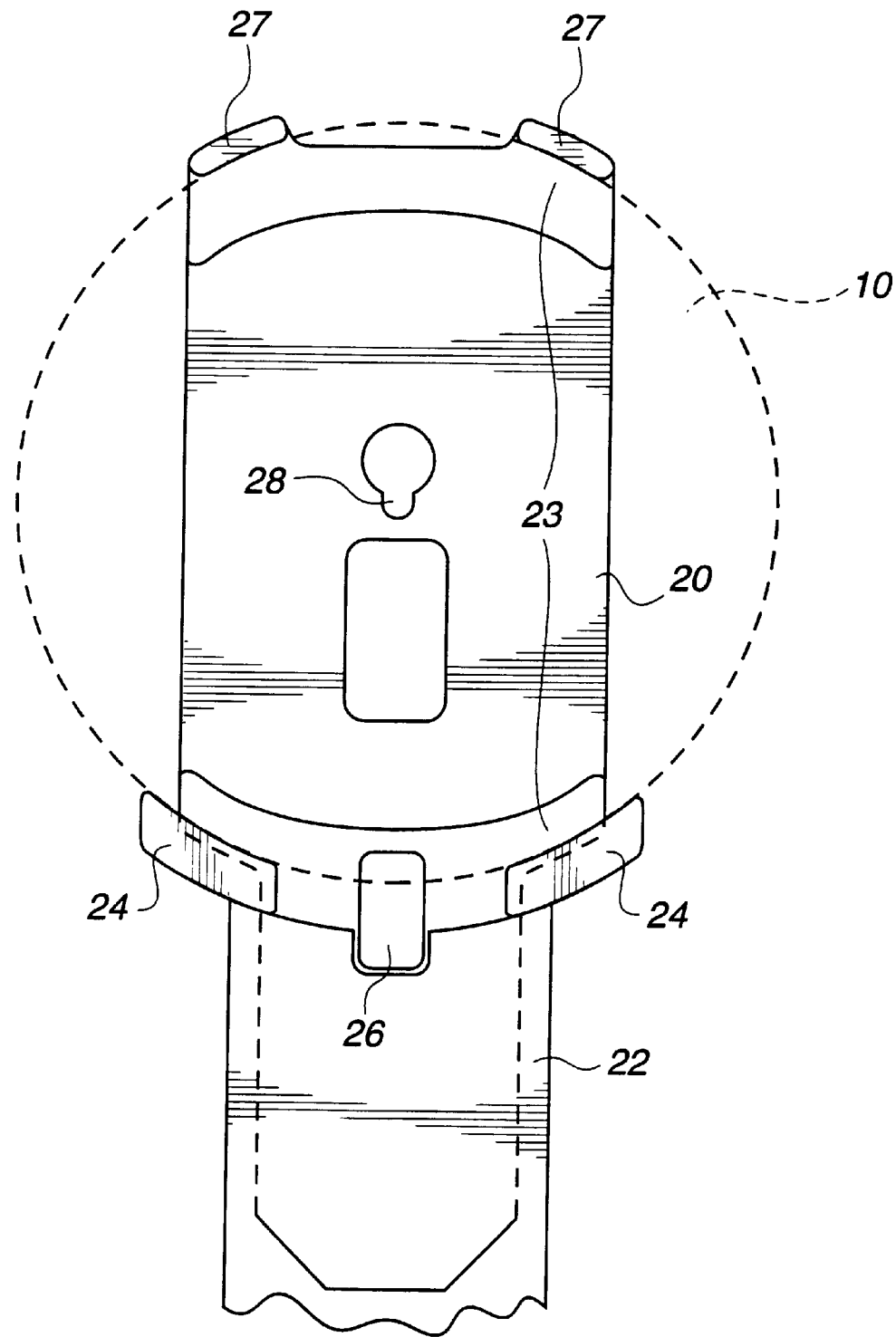
FIG. 1B is a top plan view of a robot blade.

The magnetically coupled (MC) robot arm assembly consists of four parallel linkages that are held in precise alignment by multiple precision bearings and a gear set to accurately control the extension. As shown in FIG. 1B, at the end of the arm is a wrist 22 of the MC robot to which the wafer blade 20 is mounted. To control the accurate placement of the wafer on the blade 20, wafer grippers 24 secured to the wrist are used. In addition, in the middle of the blade 20, there is a center hole 28 for determining the presence of a wafer 10 on the blade 20. The blade 20 also defines a pair of projections 27, commonly called shoes or keepers, located at the distal end of the blade 20. The projections 27 and the grippers 24 form a pocket 23 (shown with a dotted line) in which a wafer 10 is placed. The wrist 22 and the blade 20 move with respect to each other so that a wafer can be secured in the pocket 23 by altering the distance between the projections 27 attached to the blade 20 and the grippers 24 attached to the wrist 22. A different size blade may be used with the wrist 22 for a wafer of various sizes.

In addition, when the wafer transport robot 18 reaches into a process chamber 6 or a wafer cassette, the grippers 24 extend away from the projections 27 to enlarge the pocket 23 for easy placement of the wafer 10 onto the blade 20. Once the wafer 10 is placed on the blade 20, the grippers 24 retract toward the projections 27 so that the pocket 23 is reduced to the proper size for the wafer. The grippers 24 hold the wafer in the pocket 23 by the use of two leaf springs (not shown) that cradle the wafer in the pocket. As noted above, the grippers 24 extend (which in effect closes the pocket) as the robot retracts away from a process chamber 6, and the grippers 24 recede (opens up the pocket) as the robot extends.

Ideally, the wafers 10 being transported by the wafer transport robot 18 are situated at the wafer's nominal position within the pocket 23 of the blade 20 of the wafer transport robot 18. When the wafer 10 is disposed at its nominal position on the blade 20, the transport robot 18 will accurately move the wafer to its destination position within either the storage elevator 14 or the process chambers 6. In practice, however, wafers are not always disposed at or substantially near their nominal position on the blade 20, causing the wafer transport robot 18 to move the wafer 10 to a position displaced away from the wafer's intended destination position. Also, breakage or damage to the wafers 10 may result. Under such circumstances, it is desirable for the wafer position error detection and correction system of the present invention to alter the linear and rotational aspect of the wafer transport robot 18 to compensate for the wafer misalignment, thereby ensuring that the wafer 10 is accurately transported to its intended destination. Alternatively, the wafer processing system alerts an operator when the misalignment of the wafer is not machine correctable.

In the preferred embodiment of the present invention, the position of a wafer 10 is detected as the wafer 10 is moved about the transfer chamber 16 by the wafer transport robot 18. In particular, the position of a wafer 10 is detected whenever the wafer 10 is removed from either any one of the process chambers 6 or the wafer cassette 17. The position of the wafer 10 disposed on the blade 20 of the wafer transport robot 18 is measured while retracting the arm of the wafer transport robot 18 toward the zero position. The zero position of the wafer transport robot is defined as the position in which the linear extension of the wafer transport robot 18 is fully withdrawn from the wafer storage elevator 14 or the process chamber 6, so that the wafer transport robot 18 makes clear rotation within the transfer chamber 16 without making any contacts.

To determine whether the wafer 10 is properly seated in the pocket 23 of the blade 20, data points are taken as the edge of a slot 26 passes through the wafer detection sensor 60 (shown in FIG. 2). The wafer detection sensor 60 finds the start of the slot 26 in the blade 20 and the leading edge of the wafer 10. The distance between the slot edge and the wafer edge is used to determine whether a wafer is located properly in the pocket 23. By knowing the linear extension of the wafer transport robot 18 when the slot edge and the wafer edge passes by the wafer detection sensor 60, the position of the wafer can be unambiguously determined. More specifically, the microcontroller 68 uses a signal from the detection sensor 60 and motor position encoder output signals, with each pulse from the motor position encoder indicating the movement of the blade 20, to determine the position of the wafer 10 with respect to the blade 20. It is preferable that one wafer detection sensor 60 be disposed at the entrance/exit of each process chamber 6 and an input/output slit value (which is described later) near the wafer cassette to detect a position of the wafer 10 to determine whether a wafer 10 is properly on the blade 20 each time the blade 20 picks up a wafer from a process chamber 6 or the wafer cassette.

A wafer detection sensor 60 for use with the present invention is illustrated in FIG. 2. A central cover 30, also known as a load lock, which defines the upper bound of the transfer chamber 16, defines a generally circular opening 32 which is sealed with a window 34, which might be a thick plexiglass plate or the like, allowing the interior of the transfer chamber 16 to be optically sensed from above.

Figure 6:
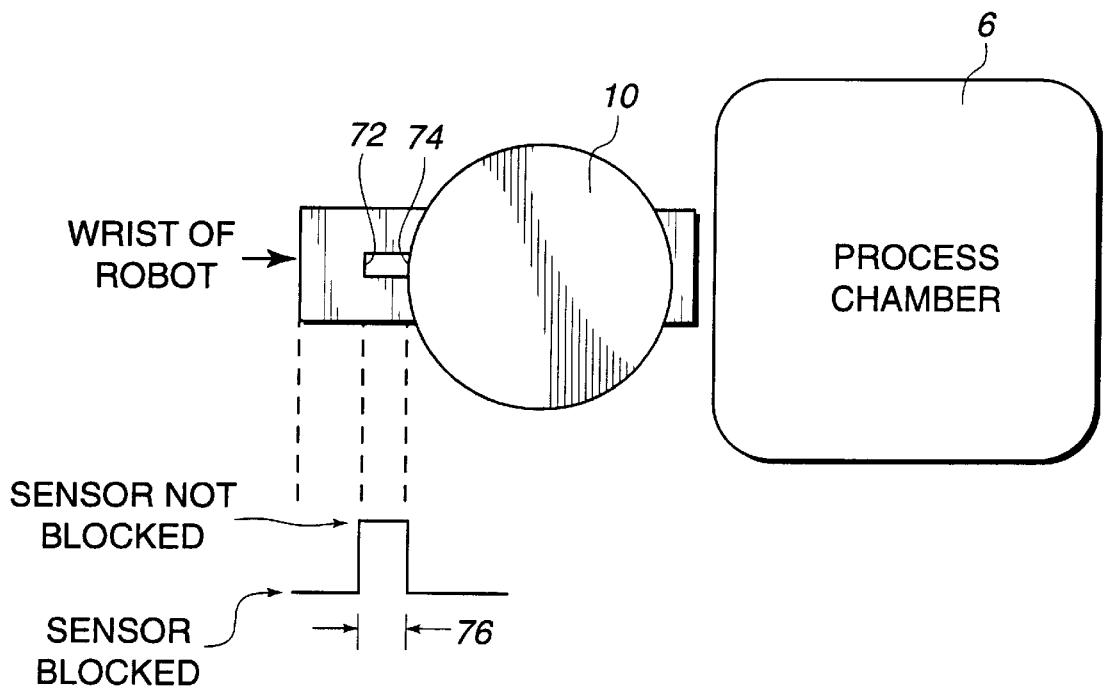
FIG. 6 shows a wafer-on-blade detection condition and corresponding signals generated by the sensor system.

One type of wafer detection sensor 60 detects the proper positioning of a wafer 10 by measuring the signals when the edge of the slot 26 allows a beam of light 36 to pass through the transfer chamber and when the edge of the wafer 10 interrupts the beam of light 36. This may be done in any number of ways. For example, a light source may be disposed above the central cover 30 to direct a beam of light 36 through the window 34 to an optical detector 62. The output of the optical detector has a first value when the beam of light is incident on the surface of the optical detector and has a second value when the beam of light is not incident on the optical detector. When the opening of a slot 26 (shown in FIG. 1B) passes through the optical beam path 36, no longer blocking the path from the light source to the detector, the output of the detector will change from the second value to the first value. Similarly, when the edge of a wafer 10 passes through the optical beam path 36, blocking the path from the light source to the detector, the output of the detector will change from the first value to the second value. The above example is illustrated in FIG. 6. By noting the position of the wafer transport robot and counting the number of robot extension steps of a separate position encoder mounted on the gear drive when the detector output changes values, wafer position information can be determined. Preferably, a microcontroller 68 is provided in the wafer processing system. The microcontroller 68 derives wafer position information from information provided by the wafer transport robot 18, such as steps of a position encoder mounted on the gearing (not shown), and the wafer detection sensor. As is schematically illustrated in FIGS. 2 and 3A, the microcontroller 68 may be coupled to a computer 69, which may be the computer which ultimately controls the operation of the wafer processing system.

FIG. 2 of the present invention illustrates a preferred wafer detection sensor in accordance with the present invention. The illustrated position for a separate sensor for each process chamber defines an optical beam path 36 and outputs a signal of a first value when the optical beam path is uninterrupted and outputs a signal of a second value when the optical beam path is blocked. It is desirable to minimize the number of electrical connections that must be made to the interior of the wafer processing system. Accordingly, particularly preferred embodiments of the FIG. 2 position sensor locate both the light source and the detector on the outside of transfer chamber 16. This is conveniently accomplished in the embodiment of FIG. 2 with a detection sensor 60 that includes both a light source and a detector within a single housing. Suitable detection sensors include the PZ2-41, a self-contained photo-electric sensor, manufactured by Keyence Corporation of America of Woodcliff Lake, N.J. The light beam 36 from the detection sensor 60 is directed through the window 34 in the central cover 30 into the transfer chamber 16 and toward the floor 42 of the transfer chamber 16. The light beam 36 is reflected from a reflector 62 back toward the detection sensor 60 and the returning light beam is detected by the detector within the detection sensor 60. In the preferred embodiment of the present invention, a polished aluminum reflector is used as the reflector 62. Alternatively, a corner cube prism may be used as the reflector 62. The polished aluminum reflector 62 is disposed so that light is incident on a diagonal plane of the floor 42 and with respect to what is substantially directed to a flat plane of the polished aluminum reflector 62. The light beam 36 incident on the surface of a polished aluminum reflector 62 is reflected back toward its source.

Preferably, each of the separate detection sensors 60 is mounted on the window 34 by a separate holder 44 that allows slight alignment adjustments of the detection sensor 60. The holder 44 should be stable to maintain the alignment of the detection sensor 60 during the normal operation of the wafer processing system. Similarly, the reflector 62 is preferably securely mounted to the floor 42 of the transfer chamber 16. Each of the holders 44 is preferably disposed so that the optical path between the detection sensor 60 and the reflector 62 will intercept the edge of the slot 26 and the edge of the wafer 10 being transported by the wafer transport robot 18 when the wafer 10 is removed from a process chamber 6.

The wafer detection sensor 60 of FIG. 2 has a number of advantages for use in the wafer position error detection and correction system of the present invention. The detection sensor 60 preferably emits and detects modulated visible red light, allowing the detection sensor to discriminate the wafer detection signal from the visible background radiation typically present in wafer processing environments. Synchronizing the optical detector within the detection sensor 60 with the modulation signal used to modulate the input red light signal reduces the likelihood of erroneous signal detection. Erroneous signals are also limited by the use of a slit aperture on the detection sensor 60 which has the slit size of, for example, 12 mils, to improve the resolution and selectivity of the detection sensor 60. The likelihood of erroneous signals is further limited by the preferred detection geometry of the detection sensor 60. The detection sensor 60, beam path 36 and the normal to the surface of the reflector 62 are all situated at an oblique angle to the surfaces of the window 34 in the central cover 30, reducing the possibility of detecting light reflected either by the window 34 or the wafer 10. This geometry also limits the possibility that a background or ambient light source will erroneously be detected by the position sensor as a wafer position signal.

The preferred detection sensor 60 has the further advantage that the detector output switches between two signal levels, which correspond to the typical logical one and zero of computer systems, when the intensity of the light incident on the detector rises above or falls below a predetermined threshold level. Accordingly, the output of the detection sensor 60 is readily compatible with the computer which controls wafer transport and the wafer position error detection and correction system of the present invention. If an optical detector is used which outputs signals which are not directly computer compatible, then it ordinarily will be necessary to convert the detector output to a computer compatible signal. Methods for performing such signal conversion are well known in the art.

Another advantage of the present set up is that all of the electronics of the preferred embodiment of the present invention are located outside the vacuum transfer chamber. This allows for easy maintenance, and the electronics do not have to be turned off due to heat build up, whereas any electronics in a vacuum environment must be turned off due to inability to dissipate heat.

As an alternative to the sensor assembly described above, a different sensor assembly may be used that does not require the use of a reflector. In another embodiment of the present invention, as shown in FIGS. 3A and 3B, the sensor 60 detects a light signal that reflects off of the wafer 10 rather than a reflector. The same detection sensor 60 as the one described above may be used to sense the presence or absence of an object in its field of view through the slot 26 of the blade 20. In this embodiment, the detection sensor 60 is positioned to measure the leading and trailing edges of the slot during the calibration procedure (which is described later) to store that data as the reference values. Thereafter, the output of the detection sensor, which produces a first value if the object is present, i.e., a reflected optical signal is detected by the detection sensor 60 reflected from the wafer 10, and produces a second value if there is no object. Whenever there is a transition in the output signal value, the microcontroller counts motor position encoder output pulse signals, each pulse indicating the movement of the blade 20. Thus, the wafer's position with respect to the blade 20 can be measured.

Figure 4A:
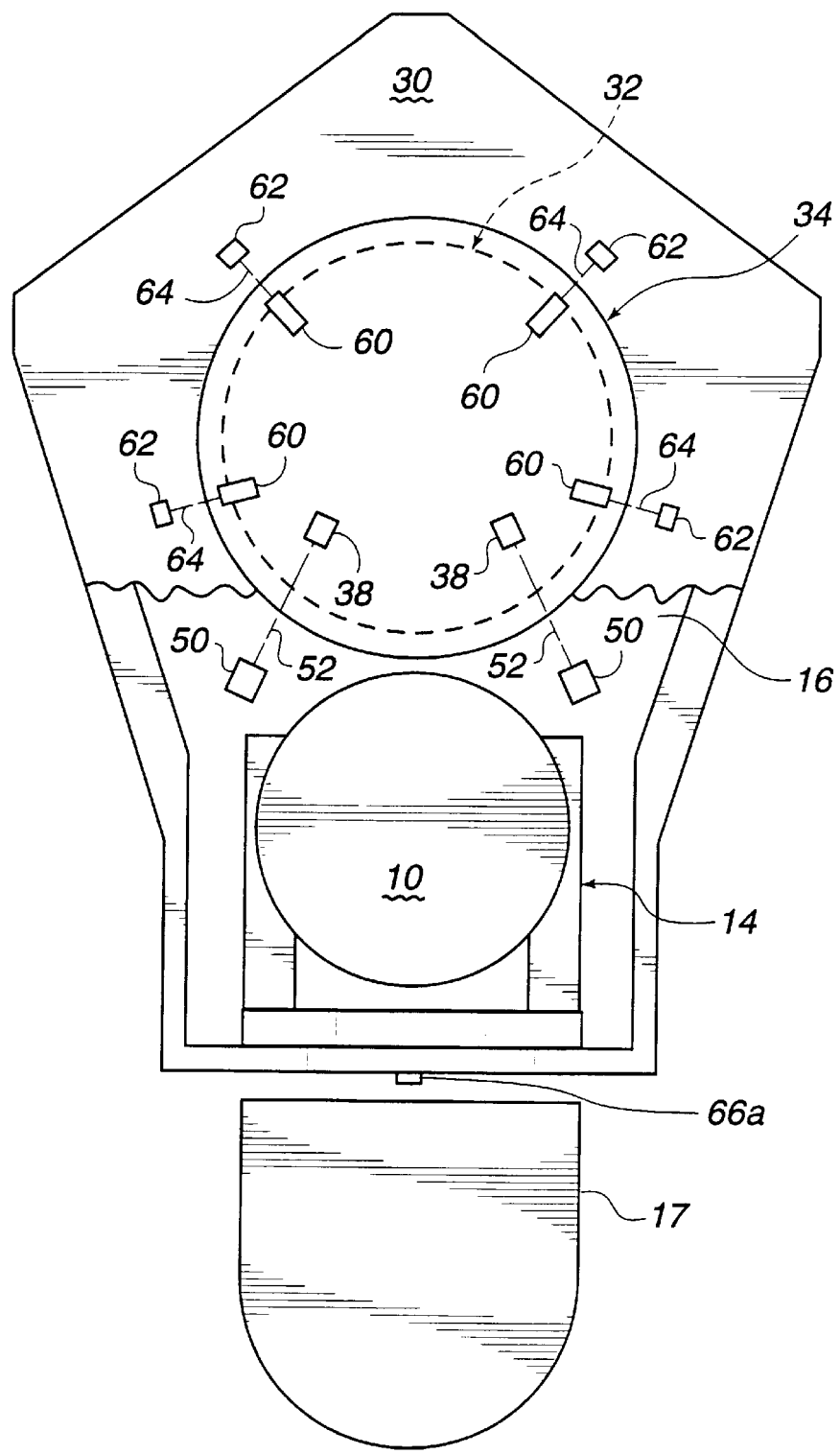
FIG. 4A is a top view of a wafer position error detection and correction system in accordance with the present invention.

FIG. 4A illustrates the preferred sensor assembly for the present invention. Preferably, four detection sensors 60 and four reflectors 62 are installed in the FIG. 4A wafer position error detection and correction system. Each of the four detection sensors assemblies functions like the detection sensor of FIG. 2. In addition, FIG. 4A further illustrates two detection sensors 38 and two reflectors 50 which are used in the wafer processing system described in U.S. Pat. No. 5,563,798 wherein column 2, line 45—column 16, line 34 are incorporated herein by reference. The four assemblies are preferably installed so that a wafer 10 disposed at its nominal position on the blade 20 of the wafer transport robot (not shown in FIG. 4A) will interrupt the respective beam paths 64 of the preferred detection sensors 60 when the blade 20 is retracted from a process chamber 6. The detection sensors 60 are preferably mounted on the surface of the window 34 of the central cover 30 so that the detection sensors 38 transmit and receive light through the transfer chamber 16 at an angle oblique to the plane of the window 34 and oblique to the plane in which the semiconductor wafer is transported. The detection sensors 60 and the reflectors 62 are respectively mounted to define a preferred plurality of beam paths 64. Mounting of each position sensor assemblies is preferably accomplished so that separate one of the beam paths 64 preferably intersects the edge of the slot 26 at an equidistant position when the blade 20 is retracted from a separate one of the process chambers 6. Cabling, schematically illustrated in FIG. 2, connects the output of the position sensors to the microcontroller 68, which in turn is connected to the computer 69 of the processing system.

When the stepper motor of the wafer transport robot 18 advances the wafer so that the edge of the slot 26 or the wafer 10 crosses the beam path of the detection sensor 60, the output of the detection sensor 60 changes state. That is, the output of the sensor changes indicating either that the beam path has been blocked or that a previously blocked beam path has been opened. Preferably, the output of the detection sensor 60 switches between two states, one of which corresponds to a voltage associated with a logical one and the other of which corresponds to a voltage associated with a logical zero. Alternatively, the output of the detection sensor 60 can be coupled to a circuitry, such as an analog to digital converter (ADC), to convert the sensor output to a computer compatible signal. In preferred embodiments of the present invention, the outputs of the detection sensors 60 are monitored on a regular basis to determine if the sensors have changed state in response to the most recent incremental displacement. For example, the stepper motors may be operated by a microcontroller 68 that generates an interrupt for each step. The step interrupt generated by the linear translation stepper motor increments a counter which counts how many steps the wafer transport robot has moved from the non interrupted state to the interrupted state of the light beam. When the state check indicates that the state of one of the sensors has changed since the last state check, the microcontroller 68 transmits the step count associated with that change to the computer 69 for the processing system. The computer 69 stores the step count, or another representation of the wafer transport robot position, associated with the state change in the detection sensor 60.

Preferably, the step count associated with a state change in a detection sensor is converted into a position value corresponding to the linear extension of the wafer transport robot. The processing system computer 69 may, for example, convert a step count into a distance by means of a lookup table. It is generally preferable to use a lookup table to convert step counts to distance because of a nonlinear relationship between step count and distance. Thus, the data from which the wafer position is calculated are the distances by which the wafer transport robot has been extended away from its back position when each of the position sensors change state.

As an alternative embodiment of the present invention, instead of counting the encoded step signal from a position encoder, a clock signal representing the traveling time of the blade with respect to the detection sensor may be counted to determine the distance. The clock signal may be converted into a distance by means of a lookup table or may be calculated based on the blade speed.

I/O Sensor

Figure 4B:
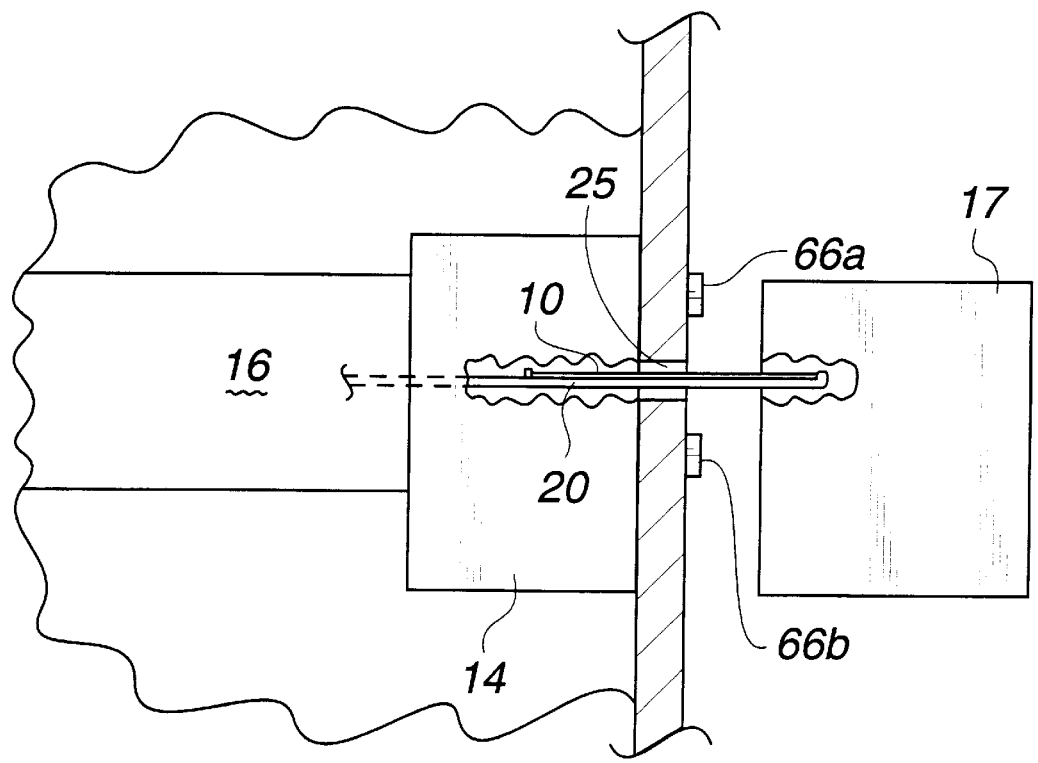
FIG. 4B illustrates the transfer of a wafer from a cassette to a transfer chamber through an input/output slit valve.

Wafer presence detection in the transfer chamber 16 is accomplished by using the detection sensors 60. As noted above, the detection sensors 60 are located at the entrance/exit of each process chamber 6, and at the storage elevator 14. The detection sensor at the storage elevator 14 is called an input/output (I/O) sensor. The I/O sensor 66a and a I/O sensor receiver 66b, which are shown in FIG. 4B, are located outside the transfer chamber 16. The I/O sensor 66a and the receiver 66b are mounted at the I/O slit valve opening 25. Due to the space restriction, instead of the detection sensor 60 being mounted near the entrance of each process chamber 6, the I/O sensor 66a uses fiber optics. The fiber optics are routed to an opto-electronic amplifier which, along with its interface, provides the electrical signals for the wafer detection to the microcontroller. The I/O sensor 66a, in addition to verifying whether the wafer 10 is properly placed in the pocket 23 of the blade 20, verifies that no wafer is accidentally sitting in the I/O slit valve opening 25, such that the wafer would be broken if the slit valve is closed or the cassette 17 or the elevator 14 is moved.

Wafer Presence Detection

Wafer presence detection system indicates whether a wafer 10 is present on the blade 20. This detection is performed when the robot is not moving and the blade 20 is located under one of the detection sensors 60. Without a wafer present, the sensor beam will pass through the center hole 28 in the blade 20 (shown in FIG. 1B). Otherwise, the wafer 10 will block the beam. However, this method cannot tell if the wafer is properly placed in the pocket of the blade. Wafer presence detection can be used whenever the blade is expected to be empty, because in certain instances the wafer 10 might accidentally remain on the blade 20. In addition, the wafer presence detection is used when a wafer is picked up from the wafer elevator 14, or before transferring a wafer 10 off the blade 20.

The detection sensors 60 are located on the window 34 of the load lock cover 30 such that the sensor 60 is lined up with the center hole 28 in the blade (shown in FIG. 1B) when the blade 20 is facing the process chamber 6 and the extension is at zero, which is also know as the zero position. The I/O sensor 66a is lined up with the center hole 28 in the blade 20 when the wafer transport robot's rotation is facing the cassette 17 and the arm is extended so that the blade 20 is between the I/O sensor 66a and the receiver 66b. The amount of extension of the robot may be stored in the computer as a system constant.

Figure 5A:
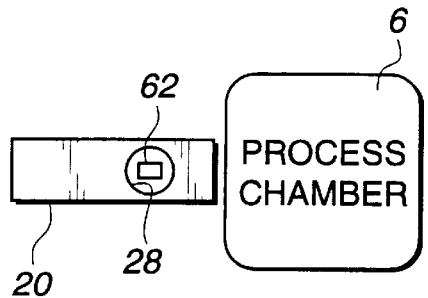
FIG. 5A shows a condition where the wafer is not on the blade.
Figure 5B:
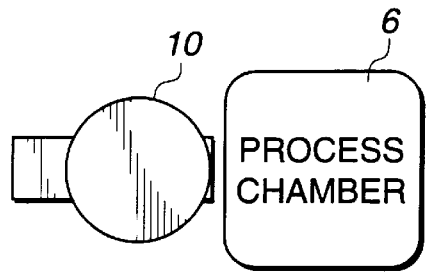
FIG. 5B shows a condition where the wafer is on the blade.

As shown in FIG. 5A, when there is no wafer 10 present on the blade 20, the light signal transmitted from the detection sensor 60 will reflect off of the reflector 62. This will cause the detection sensor 60 to generate a first value to the microcontroller 68 signifying that there is no wafer 10 on the blade 20. FIG. 5B shows the condition in which the wafer 10 is present on the blade 20, and thus blocking the reflector 62. In this condition, the detection sensor 60 generates a second value to the microcontroller 68 signifying that there is a wafer 10 on the blade 20.

Wafer-on-Blade Position Detection

Wafer-on-blade position detection is performed by retracting the blade through the detection sensor 60 and the reflector 62 and finding the slot edge 72 in the blade 20 and the leading edge 74 of the wafer 10, as shown in FIG. 6. Each edge is the number of extension step counts from the process chamber 6 pick-up position to the edge. The slot edge 72 step count is subtracted from the wafer edge 74 step count to determine a difference step value 76, which is used determine if the wafer is properly located in the blade pocket 23.

FIG. 6 shows the detection sensor states for a typical wafer-on-blade position detection from a process chamber 6. At the start of wafer-on-blade detection, the detection sensor 60 will be blocked when the blade is extended into a process chamber 6. As the blade 20 is retracted through the detection sensor 60, the sensor is blocked by the wrist of the robot, and then is not blocked starting at the slot edge 72, and finally is blocked again starting at the leading edge 74 of the wafer 10. Similarly, when using the I/O sensor 66a and the receiver 66b (shown in FIG. 4B), the I/O sensor starts out blocked by the arm of the robot and the first edge in the sensor signal will represent the slot edge.

Figure 7A:
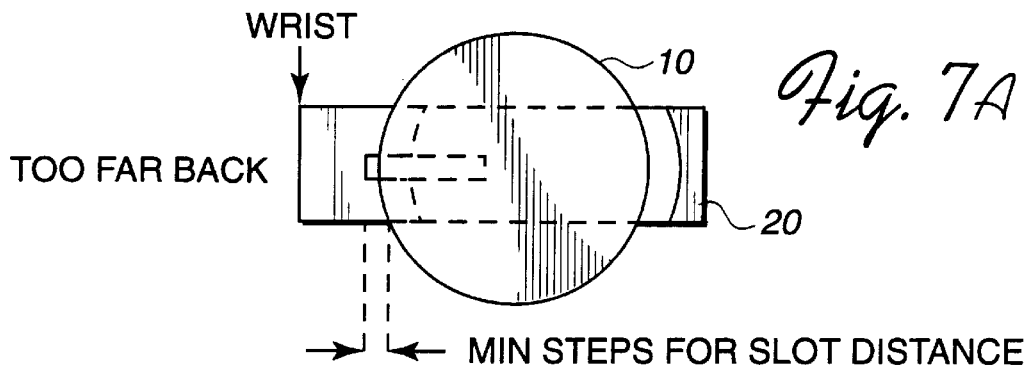
FIG. 7 shows various wafer-on-blade conditions.
Figure 7B:
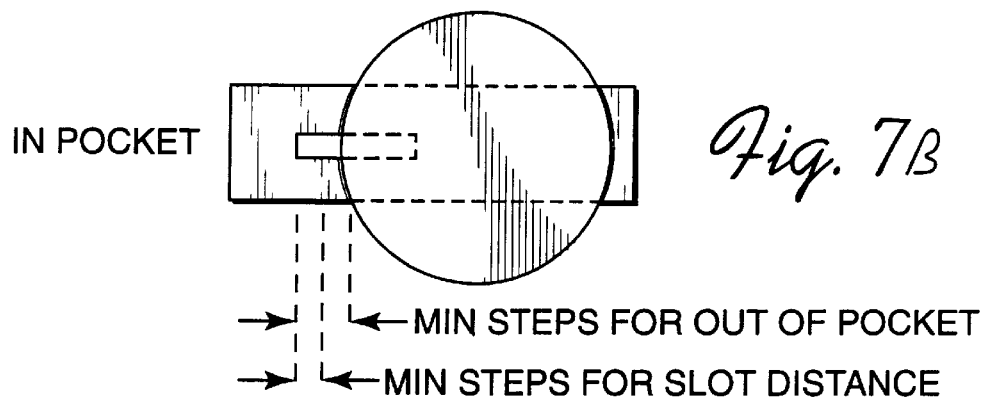
Figure 7C:
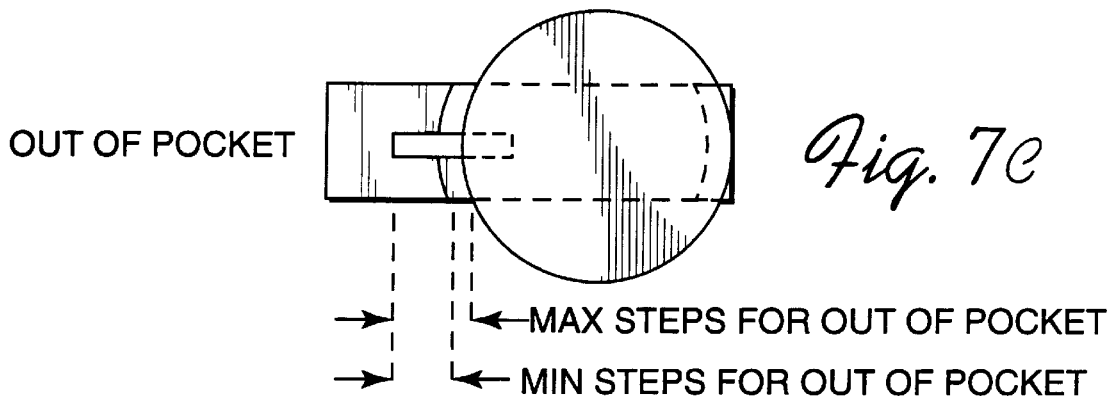
Figure 7D:
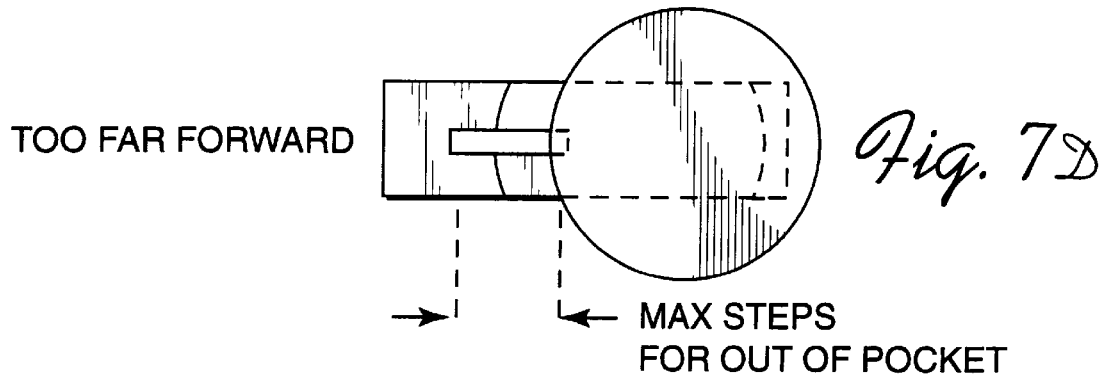

The measured steps, which can be calculated to a distance, can be in one of four possible ranges, as shown in FIGS. 7A–7D. In FIG. 7A, if the distance is less than the minimum steps for optimal slot distance, then the wafer 10 is too far back on the blade 20. If the measured distance is between the minimum steps for slot distance and the minimum steps for out of pocket, then the wafer 10 is in the pocket 23, as shown in FIG. 7B. If the measured distance is between the minimum steps for out of pocket 23 and the maximum steps for out of pocket 23, then the wafer 10 is out of the pocket 23, as shown in FIG. 7C. If measured distance is greater than the maximum steps for out of pocket 23, then the wafer 10 is too far forward on the blade 20, as shown in FIG. 7D.

For each of the above states, the wafer position error detection and correction system makes four possible determinations of the wafer-on-blade status. If the wafer 10 is in the pocket 23 and requires no correction, the system considers this as condition one. If the wafer 10 is out of the pocket 23 but can be centered using the built in centering mechanism, which consists of the grippers 24 of the blade 20, the system considers this as condition two. If the wafer 10 is out of the pocket and correctable by the wafer positioning system described in U.S. Pat. No. 5,563,798, the system considers this as condition three. Finally, if the wafer 10 is out of the pocket 23 and not correctable by the system, the system considers this as condition four. For conditions one and two, as described above, the mechanical grippers 24 will automatically center the wafer 10 as the blade 20 is retracted either from the process chamber 6 or the storage elevator 14. The system then continues with normal wafer processing sequence without operator intervention. Under condition two, when inserted into another process chamber, the system may verify the wafer-on-blade position as the wafer 10 is inserted into the next chamber.

For condition three, when the determination is made that the wafer 10 is out of the pocket 23, the system slows the robot rotation and extension to pre-determined system constant values so as not to lose the wafer as the blade rotates to the zero position. There, it uses the wafer position sensors, as described in U.S. Pat. No. 5,563,798, to determine the wafer 10 position relative to the blade 20. The wafer transport robot 18 will center the wafer 10 relative to the storage elevator 14 and temporarily place the wafer 10 into an empty slot of the storage elevator 14. It will then pick the wafer up and move it to the next position in the wafer sequence. The condition three does not require operator intervention.

For condition four, the system will halt and preferably an alarm will sound. The operator has an option to attempt manual recovery or to physically re-position the wafer 10 and continue with the processing.

Wafer-on-blade detection is used whenever a wafer is picked up from a cassette 17 or a process chamber 6. Wafers in the cassettes and process chambers can be out of position, and thus wafer-on-blade detection is required for these transfers.

Wafer-on-Blade Correction for Condition Three

When the wafer-on-blade detection determines that a wafer 10 is not properly placed in the pocket 23, such as in condition three, then wafer-on-blade correction is performed. During the wafer-on-blade correction, the robot speed is substantially slowed because the wafer is not properly held mechanically in the blade pocket 23, and thus, the wafer 10 can easily slide farther off the blade 20. If the destination of the wafer transfer sequence is the storage elevator 14, then the wafer-on-blade correction uses the destination elevator slot to correct the position of the wafer 10. Otherwise, the nearest empty elevator slot is used.

To correct the wafer position, the wafer edge data is collected using the two elevator sensors, which are described in U.S. Pat. No. 5,563,798. The sensors get four wafer edges: two leading edges and two trailing edges. These four edges are used along with the calibration wafer edge data to calculate the wafer offset from the calibrated wafer data. As a result, robot extension and rotation correction values are calculated from the wafer offset and the wafer is set in the empty elevator slot with these correction adjustments. The wafer is therefore centered in the elevator slot. After the wafer-on-blade correction sequence is completed, the recentered wafer is placed in the elevator slot. The detailed description of the wafer-on-blade correction is described in U.S. Pat. No. 5,563,798.

Sensor Calibration Procedure

In the initial setup of a sensor system for a particular processing system, it will typically be necessary to ascertain the exact position of the leading edge of a wafer with respect to the slot edge. Calibration is necessary to determine, for example, the measured distance between the wafer edge and the slot edge within the processing system. The measured distance information derived from the calibration procedure is generally stored for use in future determinations of wafer position with respect to the blade. This is most easily accomplished by calibrating the sensor system as installed in the processing system with the particular combination of detection sensors 60, stepper motors, linear and rotational translation linkages, wafer transport blade 20 and cassette handler 17 that comprise the wafer handling system of the processing system. Typically, calibration such as this will need to be performed after the initial installation of the detection sensors 60 in the processing system and whenever the alignment of the sensors or the wafer handling system is altered after initial installation.

The calibration procedure preferably begins with a technician properly placing a wafer 10 in the blade 20 of the wafer transport robot. Upon initiation of the calibration routine, the calibration function collects multiple samples, for example, five samples, of wafer edge and slot data for a centered wafer on the blade and stores the averaged calibration data as system constants. The calibration data is used during the wafer-on-blade correction to determine the wafer offset with respect to the blade 20. Recalibration will be necessary after major servicing of the processing assembly.

Automatic Control

The wafer position error detection and correction functions will be called by the robot control software at appropriate points. The wafer detection and correction functions will interface with the microcontroller 68 to read the sensors and step counts. The wafer position error detection and correction system will, then, execute the algorithms for wafer detection and, in necessary, correction. Finally, the control will be returned to the wafer transfer sequence. Based on the result of the wafer detection and correction, the wafer transfer sequence will either continue with the sequence or go into an error handing sequence which may include setting an alarm to notify an operator.

Manual Control

Manual operation of wafer presence, wafer-on-blade detection and wafer-on-blade correction is allowed in lieu of the automated sequence. For example, when a wafer presence option is selected, the wafer presence detection is performed using the wafer sensor at a process chamber 6 at which the rotation of the wafer transport robot is facing. If the rotation is facing the I/O slit valve and is extended past the I/O slit valve, then the wafer presence detection is performed using the I/O sensor.

If the wafer-on-blade detection option is selected and if the rotation is facing a process chamber 6, then the blade 20 is moved into the process chamber 6 and wafer-on-blade detection is performed as the blade 20 is retracted to the zero position. If the rotation is facing the I/O slit valve, then the blade 20 is moved out to the cassette and the wafer-on-blade detection is performed as the extension is retracted to the zero position.

If the wafer-on-blade correction option is selected, the wafer is transferred from the blade 20 to an empty slot of the storage elevator 14 with wafer correction applied.

While the present invention has been described with reference to specific preferred embodiments thereof, it will be understood by those skilled in this art that various changes may be made without departing from the true spirit and scope of the invention. In addition, many modifications may be made to adapt the invention to a given situation without departing from its essential teachings.

What is claimed is:

1. A wafer position error detection system comprising:
   a wafer handling chamber having a vacuum sealable opening for admitting wafers from a region external to the wafer handling chamber;
   at least one wafer holding chamber disposed adjacent to the wafer handling chamber, the wafer holding chamber having an opening large enough to admit a wafer, the wafer holding chamber including a valve for closing the opening;
   a wafer transport robot capable of translating a wafer along a first coordinate direction and along a second coordinate direction, the wafer transport robot having a blade adapted for carrying wafers, wherein the blade defines a slot;
   at least one detection sensor disposed to detect an edge of the slot and an edge of the wafer as the wafer is retracted from or placed into the wafer holding chamber;
   a controller device responsive to the detection sensor, wherein the controller device identifies the distance between the edge of the slot and the edge of the wafer on the blade as the wafer transport robot is translated along the first coordinate direction, and detects as a function of said identified distance a condition in which a wafer disposed on the wafer transport robot blade is displaced.

2. A wafer position error detection system of claim 1, wherein the wafer transport robot has a position encoder which provides a feedback signal and said identification of the distance is performed in response to said feedback signal from said position encoder of the wafer transport robot in the first coordinate direction and a sensor output signal from the detection sensor.

3. A wafer position error detection system of claim 2, wherein the controller device determines a misalignment of the wafer with respect to the blade such than the controller device inhibits a corrective action when the misalignment of the wafer is within a predetermined value.

4. A wafer position error detection system of claim 3, further including:
   means for adjusting the wafer transport robot to correct for the misalignment of the wafer.

5. A wafer position error detection system of claim 2, wherein the controller device determines a misalignment of the wafer with respect to the blade such than the controller device generates a signal to inform an operator if the misalignment of the wafer is more than a predetermined maximum value.

6. A wafer position error detection system of claim 1, wherein the blade further defines a center hole.

7. A wafer position error detection system of claim 6, wherein the detection sensor determines a presence of the wafer through the center hole, when the wafer transport robot is fully retracted and withdrawn away from the wafer holding chamber.

8. A wafer position error detection system of claim 1, wherein the controller suspends operation of the transport robot if the wafer is displaced beyond a predetermined correctable displacement level.

9. A wafer position error detection system of claim 1, wherein the controller device is operative when the wafer transport robot is substantially extended and withdraws away from the wafer holding chamber.

10. A wafer position error detection system of claim 1, wherein the edge of the slot of the blade transported along the first coordinate direction crosses a detection position and a slot detection signal is generated, and the edge of the wafer on the blade crosses the detection position and a wafer detection signal is generated.

11. A wafer position error detection system of claim 1, wherein the wafer transport robot has a speed encoder which provides a clock signal and said identification of the distance is performed in response to said clock signal from said speed encoder of the wafer transport robot in the first coordinate direction and a control sensor output signal from the detection sensor.

12. A wafer position error detection system of claim 1, wherein the detection sensor produces a light beam which reflects off of a blade and off of a wafer to detect the edge of the slot and the edge of the wafer, respectively.

13. A wafer position error detection system as in claim 1, wherein said wafer holding chamber comprises a processing chamber.

14. A wafer position error detection system of claim 1, wherein said system has a single detection sensor disposed to detect an edge of the slot and an edge of the wafer as the wafer is retracted from or placed into the wafer holding chamber.

15. A method of detecting and correcting a position of a wafer within a wafer position error detection and correction system comprising the steps of:

transporting a wafer on a blade of a wafer transport robot, wherein the blade includes a slot and defines a center hole;

identifying the distance between an edge of the slot and an edge of the wafer on the blade as an edge of the slot and an edge of the wafer passes through a detection sensor;

determining a wafer offset value by comparing the wafer distance to a nominal wafer distance;

detecting a condition in which a wafer disposed on the blade is displaced by more than a predetermined correctable displacement amount;

adjusting a destination coordinate of the wafer transport robot in accordance with the wafer offset value; and suspending operation of the wafer processing system upon detecting that the wafer is displaced by more than the predetermined correctable displacement amount.

16. A method of claim 15, wherein the step of identifying a wafer distance comprises the steps of:

passing an optical beam through a wafer detection position;

detecting a change in the intensity of the optical beam corresponding to the passage of the edge of the slot and the edge of the wafer.

17. A method of claim 16, wherein the step of identifying a wafer distance further comprises the step of:

directing the optical beam from a position external to a wafer transport chamber so that the optical beam propagates in a direction disposed away from a normal to a surface of the wafer during a wafer transport operation.

18. A method of claim 15, further comprising the steps of:

positioning a wafer at a nominal position with respect to the wafer transport robot;

determining a first calibration point and a second calibration point by detecting the edge of the slot of the blade and the edge of the wafer, respectively;

calculating calibration values from the first calibration point and the second calibration point; and storing the calibration values in the wafer position error detection and correction system.

19. A wafer position error detection and correction system comprising:

a wafer handling chamber having a vacuum sealable opening for admitting wafers from a region external to the wafer handling chamber, the wafer handling chamber having at least a portion of a wall formed from a substantially transparent material;

at least one wafer holding chamber disposed adjacent to the wafer handling chamber, the wafer holding chamber having an opening large enough to admit a wafer, the wafer holding chamber including a valve for closing the opening;

a wafer transport robot capable of translating a wafer along a first coordinate direction and along a second coordinate direction, the wafer transport robot having a blade adapted for carrying wafers, wherein the blade has a slot and defines a center hole;

at least one detection sensor disposed to detect an edge of the slot and an edge of the wafer as the wafer is retracted from the wafer holding chamber, the detection sensor including:

a light source disposed external to the wafer handling chamber, the light source aligned to direct an incident beam of light through the substantially transparent material into the wafer handling chamber;

a reflector disposed within the wafer handling chamber so that at least a portion of the incident beam of light is reflected from the reflector as a reflected beam of light, wherein the reflector directs the reflected beam of light through the substantially transparent material; and a detector disposed external to the wafer handling chamber to receive the reflected beam of light from the reflector, wherein the light source and the detector are disposed to detect an edge of the slot when the slot allows the reflected beam of light to reflect through the transparent material and to further detect an edge of the wafer when the wafer intercepts a beam of light as the wafer is retracted from the wafer holding chamber; and a controller device responsive to the detection sensor, wherein the controller device identifies the distance between the edge of the slot and the edge of the wafer on the blade as the wafer transport robot is translated along the first coordinate direction, detects as a function of said identified distance a condition in which a wafer disposed on the wafer transport robot blade is displaced and controls the wafer transport robot to correct for the displacement of the wafer.

20. A wafer position error detection and correction system according to claim 19, wherein the reflector includes polished aluminum.

21. A method of detecting a position of a wafer in a processing system comprising the steps of:

transporting a wafer on a blade of a wafer transport robot, wherein the blade includes an optically detectable reference point;

identifying the distance between the blade reference point and an edge of the wafer on the blade as the blade reference point and an edge of the wafer passes an optical detection sensor; and determining a wafer position condition as a function of said identified distance.

22. A method as in claim 21 further wherein said condition detecting comprises:

determining a wafer offset value by comparing the wafer distance to a nominal wafer distance, said method further comprising:

controlling subsequent transport of said wafer by said transport robot to account for the wafer offset value.

23. A method as in claim 22, wherein controlling subsequent transport of said wafer includes suspending operation of the wafer processing system upon detecting that the wafer offset value is greater than a maximum correctable offset amount.

24. A method as in claim 22, wherein the blade reference point comprises a slot edge and said identifying comprises identifying the distance between the edge of the slot and the edge of the wafer on the blade as the wafer transport robot is translated along a first coordinate direction, and the identification of the distance is performed in response to a feedback signal from a position encoder of the wafer transport robot in the first coordinate direction and a sensor output signal from a detection sensor.

25. A method as in claim 22, wherein the blade reference point comprises a slot edge and said identifying comprises identifying the distance between the edge of the slot and the edge of the wafer on the blade as the wafer transport robot is translated along the first coordinate direction, wherein the identification of the distance is performed in response to a clock signal from a speed encoder of the wafer transport robot in the first coordinate direction and a sensor output signal from the detection sensor.

26. A method as in claim 22, further comprising generating a signal to inform an operator if the wafer offset value is more than a predetermined maximum value.

27. A method as in claim 21, further comprising providing a center hole in said blade and using the center hole to determine if a wafer is present on the blade when the wafer transport robot is fully retracted and withdrawn away from the wafer holding chamber.

28. A method as in claim 21, wherein the position of the wafer edge is detected by providing a light beam which reflects off of an edge of the wafer.

29. A method as in claim 21 wherein said identifying utilizes a single detection sensor.

30. A wafer positioning method comprising:
   transporting a wafer on a blade of a transport robot, wherein said blade includes a slot and a hole;
   identifying the distance between an edge of the slot and an edge of the wafer on the blade as an edge of the slot and an edge of the wafer passes a detection sensor;
   determining a wafer offset value by comparing said wafer distance with a nominal wafer distance;
   controlling said wafer transport robot to correct for said wafer offset value during subsequent wafer transport.

31. A method as in claim 30, further comprising the step of checking for the presence of the wafer on the blade by transmitting a beam toward the hole and determining whether a wafer blocks the beam.

* * * * *